United States Patent [19]

Paul et al.

[11] 4,130,888

[45] Dec. 19, 1978

[54] ISOTROPIC DATA TRACK FOR CROSS-TIE WALL MEMORY SYSTEM

[75] Inventors: Maynard C. Paul, Bloomington; Ernest J. Torok, St. Paul, both of Minn.

[73] Assignee: Sperry Rand Corporation, New York, N.Y.

[21] Appl. No.: 756,224

[22] Filed: Jan. 3, 1977

[51] Int. Cl.² ............................................. G11C 19/08
[52] U.S. Cl. ...................................... 365/87; 365/172
[58] Field of Search .................. 340/174 TF; 365/87, 365/172

[56] References Cited

U.S. PATENT DOCUMENTS

| | | | |
|---|---|---|---|
| 3,792,452 | 2/1974 | Dixon et al. | 340/174 TF |
| 3,868,659 | 2/1975 | Schwee | 340/174 TF |
| 4,075,613 | 2/1978 | Torok | 365/87 |
| 4,080,591 | 3/1978 | Torok | 365/171 |

OTHER PUBLICATIONS

IBM Technical Disclosure Bulletin-vol. 9, No. 5, Oct. 1966, pp. 505-507.
AIP Conference on Magnetism & Magnetic Materials—Dec. 9-12, 1975, pp. 624-625.

Primary Examiner—James W. Moffitt
Attorney, Agent, or Firm—Kenneth T. Grace; William E. Cleaver; Marshall M. Truex

[57] ABSTRACT

A data track formed of a strip of magnetic film having substantially zero uniaxial anisotropy, i.e., isotropic, for a cross-tie wall memory system is disclosed. The data-track-defining-strip of isotropic magnetic film utilizes its shape, i.e., its edge contour induced anisotropy, rather than its easy axis magnetic field induced anisotropy, to constrain the cross-tie wall within the planar contour of the film strip. The use of the shape induced anisotropy of an isotropic strip of magnetic film permits the use of nonlinear, i.e., curved, data tracks which curved data tracks were not permitted by the prior art cross-tie wall memory systems that were limited to the use of anisotropic magnetic film.

5 Claims, 11 Drawing Figures

CROSS-TIE BLOCH-LINE PAIR DATA PROPAGATION

RESULT OF SKEW BETWEEN MAGNETIC
FIELD INDUCED EASY AXIS AND EDGE
OF MAGNETIC FILM STRIP

ISOTROPIC DATA TRACK FOR CROSS-TIE WALL MEMORY SYSTEM

The invention described herein was made in the course of, or under, a contract with the Department of the Navy.

BACKGROUND OF THE INVENTION

The propagation of inverted Néel wall sections instead of magnetic bubbles in a serial access memory system was proposed by L. J. Schwee in the publication "Proposal On Cross-Tie Wall and Bloch-line Propagation In Thin Magnetic Films," IEEE Transactions on Magnetics, MAG 8, No. 3, pages 405–407, September 1972. Such a memory system utilizes a ferromagnetic film of 81% Ni–19% Fe of approximately 350 Angstroms (Å) thick in which cross-tie walls can be changed to Néel walls and Néels wall can be changed to cross-tie walls by applying appropriate fields. Associated with the cross-tie walls is a section of inverted Néel wall that is bounded by a cross-tie on one end and a Bloch-line on the other end.

In such a cross-tie wall memory system, information is entered at one end of the serial access memory system by the generation of an inverted Néel wall section bounded by a cross-tie on one side and a Bloch-line on the other side that is representative of a stored binary 1 and a non-inverted Néel wall section, i.e., the absence of a cross-tie and Bloch-line pair that is representative of a stored binary 0, and is moved or propagated along the cross-tie wall by the successive generation and then the selective annihilation of inverted Néel wall sections at successive memory cells along the cross-tie wall. In the D. S. Lo, et al., U.S. Pat. No. 3,906,466 there is disclosed a propagation circuit for the transfer of inverted Neel wall sections at successive memory cells along the cross-tie wall. In the L. J. Schwee U.S. Pat. No. 3,868,660 and in the publication "Cross-tie Memory Simplified By The Use of Serrated Strips," L. J. Schwee, et al., AIP Conference Proceedings, No. 29, 21st Annual Conference On Magnetism and Magnetic Materials, 1975, published April 1976, pages 624–625 there have been published some more recent results of the further development of cross-tie wall memory systems.

In prior art cross-tie wall memory systems, the magnetic film that functions as the storage medium has the property of uniaxial anisotropy provided by its easy axis induced magnetic fields, which easy axis is generated in the magnetic film during its generation in the vapor deposition process. This easy axis provides a magnetic field induced anisotropy which constrains the generation of the cross-tie wall along and parallel to the easy axis. In the above L. J. Schwee, et al., publication there are proposed serrated strips of Permalloy film, about 350 Angstroms (Å) in thickness and 10 microns ($\mu$m) in width, each of which serrated strips is etched from a planar layer of the magnetic material so that the geometric centerline of the strip is aligned along the easy axis of the film. After an external magnetic field is applied normal to the strip length, i.e., transverse the easy axis or geometric centerline of the film, the magnetization along the opposing serrated edges rotates back to the nearest direction that is parallel to the edge. This generates two large domains that are separated by a domain wall, or cross-tie wall, that is formed along the centerline of the strip. Cross-ties are formed at the necks of the serrated edges while Bloch-lines are formed in the potential wells between adjacent necks.

This serrated strip configuration, because of the contour of the opposing edges of the strip, provides the means whereby the cross-tie, Bloch-line pairs are structured at predetermined memory sections along the strip. However, because the serrated strips have M induced anisotropy incorporated into the film during deposition, such strips cannnot be utilized to permit the use of non-linear, i.e., curved, data tracks, which curved data tracks are essential to the configuration of cross-tie wall memory systems of large capacity or of digital logic function capabilities. Accordingly, it is desirable that there be provided a means whereby cross-tie wall memory systems use nonlinear, i.e., curved, data tracks to achieve the desirable characteristics of single wall, e.g., bubble, domain memory systems, such as those of the A. H. Bobeck U.S. Pat. No. 3,729,726 and the D. M. Heinz U.S. Pat. No. 3,735,145, in cross-tie wall memory systems.

SUMMARY OF THE INVENTION

The present invention is directed toward a novel cross-tie wall memory system and in particular to a data track therefor that is formed of a strip of magnetic material having substantially zero uniaxial anisotropy. This is achieved by rotating the substrate during deposition. The data-track-defining-strip of isotropic magnetic film utilizes its shape, i.e., its edge contour induced, anisotropy to constrain the cross-tie wall within the planar contour of the film strip. Accordingly, the cross-tie wall is constrained to follow the path defined by the magnetic film strip, which path may be configured into a major loop configuration for large capacity memory storage.

DESCRIPTION OF THE PRIOR ART

Figure 1:
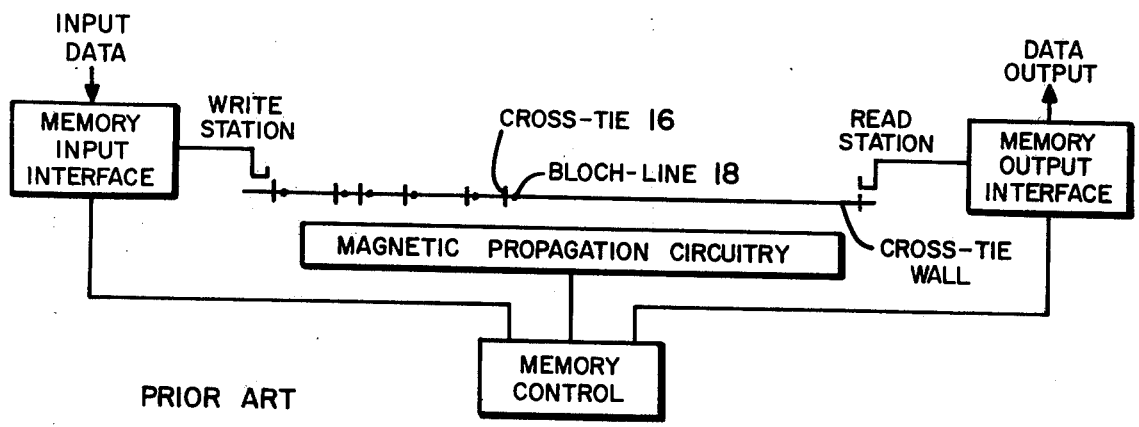
FIG. 1 is a block diagram of a prior art cross-tie wall memory system.
Figure 2:
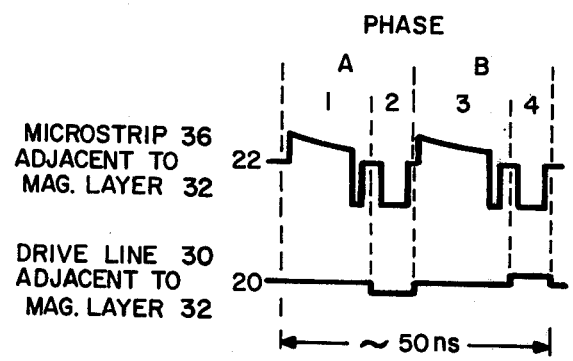
FIG. 2 is an illustration of the prior art waveforms of the signals utilized to propagate the inverted Néel wall sections along the cross-tie wall in the cross-tie wall memory system of FIG. 1.

With particular reference to FIG. 1 there is presented a block diagram of the prior art cross-tie wall memory system proposed by L. J. Schwee in the above referenced publications. FIG. 2 is an illustration of a prior art waveform of the signals utilized to propagate the inverted Néel wall sections along the cross-tie wall in the cross-tie wall memory system of FIG. 1.

In the prior art operation of a cross-tie wall memory system, as exemplified by FIGS. 1, 2, the propagation cycle utilizes two successive phases: phase A (1, 2) and Phase B (3, 4). With an inverted Néel wall section written into the write station at the start of propagation cycle 1, the phase A1 signal generates a new inverted Néel wall section at memory cell 1 that is immediately forward of the inverted Néel wall section at the write station. Next, the phase A2 signals annihilate the inverted Néel wall section at the write station. Next, the phase B3 signal generates a new inverted Néel wall section within memory cell 1 but forward of the inverted Neel wall section generated during phase A1. Lastly, the phase B4 signals annihilate the inverted Néel wall section in memory cell 1 that was generated during phase A2 leaving in memory cell 1 only the inverted Néel wall section that was generated during phase B3. At this time (at the end of propagation cycle 1), the inverted Néel wall section that is representative of a binary 1 that was initially at the write station has been transferred into memory cell 1. If during the next propagation cycle 2, when the inverted Néel wall section (1) in memory cell 1 is to be transferred into memory cell 2, an inverted Néel wall section (1) is to be simultaneously transferred into memory cell 1 from the write station, an inverted Néel wall section (1) must be written into the write station prior to the next subsequent propagation cycle 2 phase A1, otherwise a non-inverted Néel wall section, representative of a binary 0, would be transferred into memory cell 1. This propagation cycle sequence is as disclosed in the above L. J. Schwee publications cited hereinabove.

Figure 3:
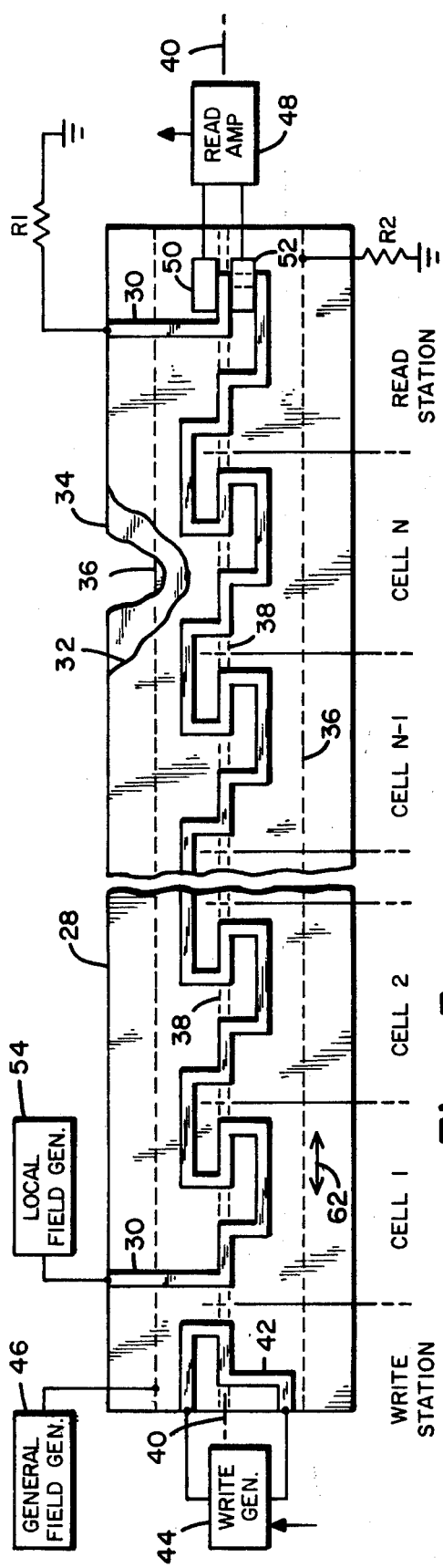
FIG. 3 is an illustration of a prior art cross-tie wall memory system.

With particular reference to FIG. 3 there is presented an illustration of the cross-tie wall memory system of the D. S. Lo, et al., U.S. Pat. No. 3,906,466, which invention is particularly directed toward memory plane 28. This memory system, except for the configuration of the drive line 30 that is above the magnetic layer 32, may be considered to be similar to that configuration taught by the hereinabove referenced publications of L. J. Schwee. In this configuration there is illustrated a non-magnetizable, e.g., glass, substrate member 34 having a copper microstrip 36 affixed to its bottom side and a thin ferromagnetic layer 32, having the easy axis 62 in the plane thereof, affixed to its top side. Affixed to the top side of layer 32 and superposed the microstrip 36 is the copper drive line 30 which is affixed to and superposed the magnetic layer 32, but separated therefrom by an insulative, e.g., SiO or Mylar, member. Drive line 30 consists of a plurality of serially-intercoupled portions each of which defines a memory cell 1 through N, that are overlaid and uniformly spaced along a cross-tie wall 38 that is oriented along a longitudinal axis 40. Along the lefthand edge of memory plane 28 and superposed the top surface of layer 32 and member 31 is a write drive line 42 driven by write generator 44. At the same end is general field generator 46 for coupling waveform 22 of FIG. 2 to microstrip 36. At the opposite end of cross-tie wall 38, at the read station, there is provided a read amplifier 48 and its associated pick-up elements 50, 52 for reading out the binary significance of the information generated by write generator 44 and serially propagated along cross-tie wall 38 by the serially-intercoupled portions of drive line 30. Additionally provided is local field generator 54, coupled to the lefthand end of drive line 30, for coupling waveform 20 of FIG. 2 to drive line 30.

Figure 5:
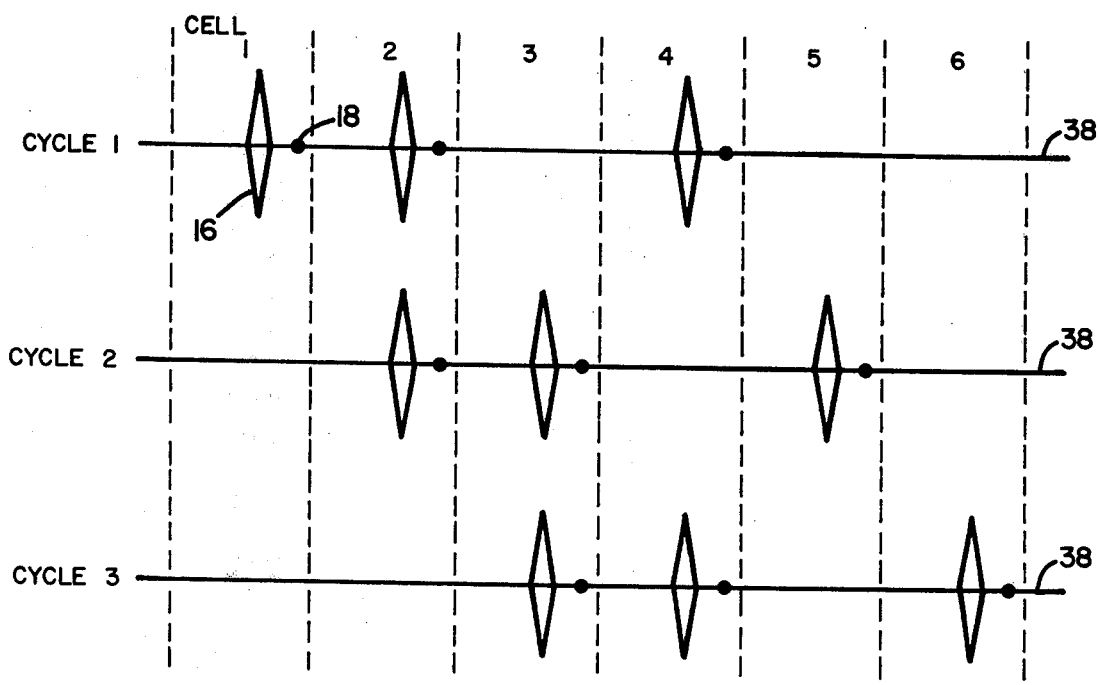
FIG. 5 is an illustration of the manner in which the binary word of FIG. 4 is propagated in the cross-tie wall memory system of FIG. 3 at successive memory cycles.
Figure 4:
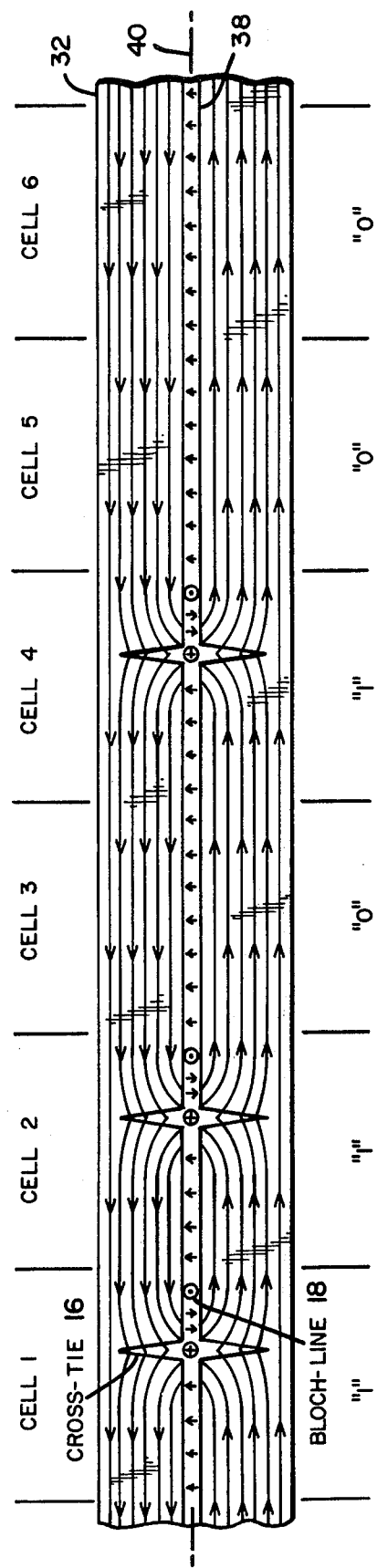
FIG. 4 is an illustration of the cross-tie wall in which is stored the binary word 110100, each binary 1 being represented by an inverted Néel wall section bounded by a cross-tie Bloch-line pair.

With particular reference to FIG. 4 there is provided an illustration of a cross-tie wall in which is stored the binary word 110100, each binary 1 being represented by an inverted Néel wall section bounded by a cross-tie, Bloch-line pair. Using FIG. 5 as an illustrative example there is provided an illustration of the manner in which the binary word of FIG. 4 is propagated through the cross-tie wall memory system of FIG. 3 at successive cycle times 1, 2, 3, ... T. Using the prior art waveforms of FIG. 2 as a typical example of the waveforms utilized to propagate the cross-tie, Bloch-line pairs, each representative of a binary 1, along cross-tie wall 38, it can be seen that at each successive cycle time all cross-tie, Bloch-line pairs are entered into cross-tie wall 38 from the left and simultaneously shifted along cross-tie wall 38 in a manner of a serial shift register to be emitted from the right-hand end, such as for example, at the read station of FIG. 3.

Figure 6:
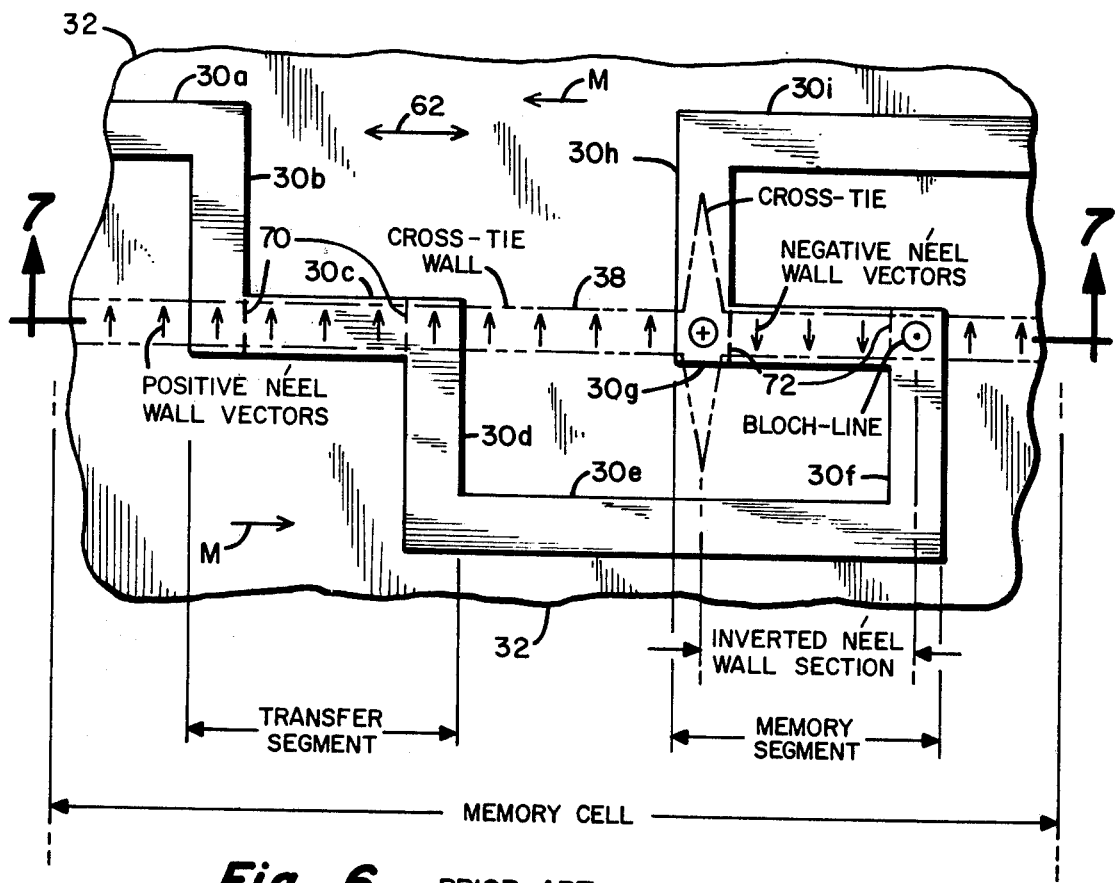
FIG. 6 is a plan view of one memory cell of FIG. 3 in which is stored an inverted Néel wall section bounded by a cross-tie on one end and a Bloch-line on the other end, which inverted Néel wall section is representative of the storage of a binary 1.

With particular reference to FIG. 6 there is presented a plan view of one memory cell of memory plane 28 of FIG. 3. In the illustrated memory cells there is stored in the memory segment thereof an inverted Néel wall section bounded by a cross-tie on one end and a Bloch-line on the other end and being representative of the storage of a binary 1. Such inverted Néel wall section is represented by the negative Néel wall vectors pointed in a downwardly direction while the remaining portion, i.e., the non-inverted Néel wall section of the cross-tie wall 38 is represented by the positive Néel wall vectors pointed in an upwardly direction. If such representative memory cell were to be redrawn for the purpose of illustrating the storage of a binary 0, the cross-tie, Bloch-line pair illustrated in the memory segment would be deleted with the cross-tie wall being represented by a continuation of the positive Néel wall vectors throughout the transfer segment and the memory segment.

Figure 7:
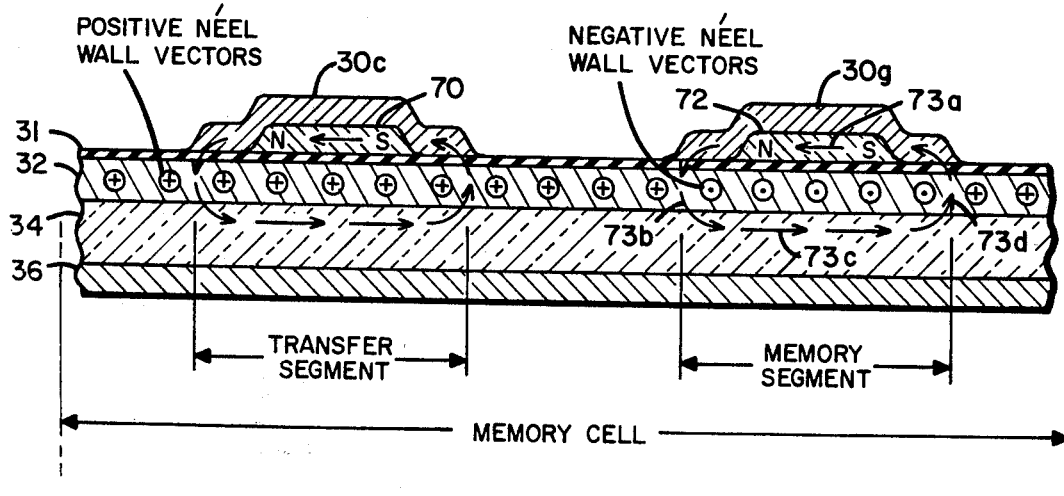
FIG. 7 is an illustration of the cross section of a memory plane of FIG. 6 taken along line 7—7 thereof illustrating the stacked, superposed elements of FIG. 6 and the magnetic vector representations therein.

With particular reference to FIG. 7 there is presented an illustration of a cross section of the memory cell of FIG. 6 taken along line 7—7 thereof for the purpose of illustrating the stacked, superposed elements of FIG. 6 and the magnetic vector representations thereof. FIGS. 6, 7 illustrate that drive line 30, in the areas of the illustrated memory cell, is comprised of a plurality of straight drive line segments 30a through 30i which straight drive line segments are intercoupled in a manner such that a positive current signal coupled to straight drive line segment 30a generates, in the area of straight drive line segment 30c, a localized field normal to its edges and in the plane of layer 32 having an upwardly directed vector orientation while such current flowing through straight drive line segment 30g generates a localized field normal to its edges in the plane of layer 32 that is oriented in a downwardly directed vector orientation. Thus, it is apparent that when a current signal is coupled to drive line 30 the localized fields in the areas of straight drive line segments 30c and 30g are both in the plane of layer 32 but are oriented antiparallel each other and normal to cross-tie wall 38 which is also oriented parallel to the uniaxial anisotropy of layer 32, represented by the easy axis 62. Note the orientation of the magnetization M of layer 32 above and below the cross-tie wall 38 as denoted by the vectors M. These oppositely directed fields provided by drive line 30 in the area of cross-tie wall 38 within the transfer segment and the memory segment of a signal memory cell provide the necessary mechanism whereby the waveforms 20, 22 of FIG. 2 permit the propagation of the binary information in cross-tie wall 38, as represented by a cross-tie, Bloch-line pair representative of a binary 1, successively through the memory cells of the cross-tie wall memory system of FIG. 3 all as schematically illustrated by the timing diagram of FIG. 5.

With reference to FIG. 7 the purpose of keepers 70, 72, illustrated as being sandwiched between the straight drive line segments 30c, 30g and layer 32, is illustrated by the counterclockwise vectors flowing into the S pole and out of the N pole of keeper 72 as localized fields represented by vectors 73a–73d, vector 73b also being representative of the magnetization in the cross-tie and vector 73d being representative of the magnetization in the Bloch-line that bound the inverted Néel wall section along straight drive line segment 30g. These localized fields 73b and 73d at the N end and at the S end of keeper 72 are normal to the plane of layer 32 and are configured to coincide with the positions of the associated cross-tie, Bloch-line pairs as they are propagated along cross-tie wall 38 and are temporarily, during their propagation down cross-tie wall 38, situated under the keepers 70 and 72 such that such cross-tie, Bloch-line pairs are established in position by the localized fields at the respective ends of the keepers 70 and 72. These localized fields provided by the keepers 70 and 72 ensure the reliable propagation of the inverted Néel wall sections as they travel down cross-tie wall 38 from cell 1 through cell N of the cross-tie wall memory system of FIG. 3.

Figure 8:
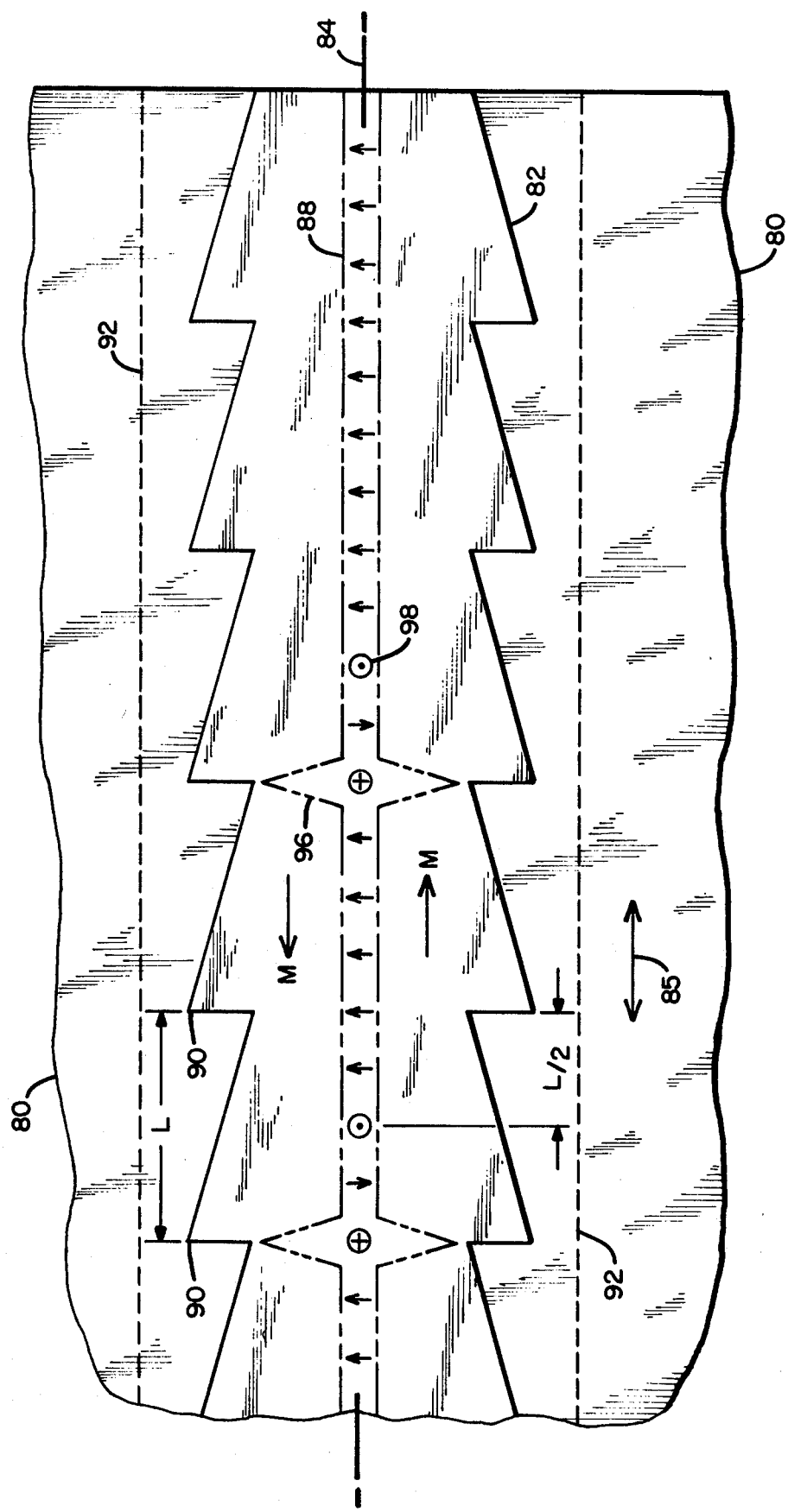
FIG. 8 is an illustration of a portion of the second prior art cross-tie wall memory system.

With particular reference to FIG. 8 there is presented an illustration of a portion of a second prior art embodiment of the cross-tie wall memory system as proposed by L. J. Schwee, et al. In this second prior art embodiment, there is shown a glass substrate member 80 having a thin ferromagnetic layer 82 affixed to the top surface thereof. Layer 82 is symmetrical about its longitudinal axis 84 having a serrated conformation and the easy axis 85 such as taught by the publication, AIP Conference Proceedings, No. 29, 21st Annual Conference on Magnetism and Magnetic Materials, 1975, published April 1976, L. J. Schwee, et al., pages 624–625. In the embodiment of FIG. 8, the easy axis 85 is oriented parallel to longitudinal axis 84, which easy axis 85 passes through the cross-tie 96, Bloch-line 98 positions on cross-tie wall 88. Also, the tips 90 of successive serrated sections of layer 82 are separated a distance L that establishes the distance between adjacent cross-tie 96 positions along cross-tie wall 88 as determined by the distance between adjacent serrations in layer 82, e.g., 25 microns (μm). Also provided is a copper microstrip 92 affixed to the bottom surface of substrate member 80. When a hard axis magnetic field much greater than the anisotropy field of the serrated strip is applied by passing a current through microstrip 92, a torque acts on the magnetization in the upper part of the strip (above the longitudinal centerline) and an opposite torque acts on the lower part of the strip as explained in D. S. Lo, et al., "Geometry of Serrated Manetic Film Strips for The Cross-tie Memory," IEEE Transactions on Magnetics, MAG 13, No. I; pages 936–937 January 1977. When the field is removed, the magnetization above and below the centerline relaxes in opposite directions, forming a domain wall (cross-tie wall) at the boundary.

DESCRIPTION OF THE PREFERRED EMBODIMENT

Shape Anisotropy Theory

The local anisotropy field of a region of a thin ferromagnetic film is defined as the magnitude of the applied hard axis field that is required to saturate the magnetization in that region in the local hard direction. A magnetic film etched into a long, narrow strip has shape anisotropy with a shape induced easy axis that is parallel to the edges of the strip. The magnitude of the shape anisotropy when measured with an anisotrometer is larger at the edges of the film strip than in the center. The magnitude of the shape induced anisotropy at the center of the film strip can be calculated by calculating the demagnetizing field of the film strip when saturated in the film plane perpendicular to the edges. This shape anisotropy, $H_{K_S}$, is given by the equation:

$$H_{K_S} = 8M \tan^{-1} T/W \tag{1}$$

where M is the saturation magnetization, T is the film thickness and W is the film strip width. Equation 1 says that a nickel-iron (NiFe) film strip 350 Å thick and 1 mil wide will have a shape anisotropy of 8.8 Oersteds.

When shape anisotropy is added to a field induced anisotropy, $H_{K_F}$ with an easy axis at an angle $\beta$ from the strip edge, the resulting total anisotropy, $H_{K_T}$, is $$H_{K_T} = (H_{K_S}^2 + H_{K_F}^2 + 2H_{K_S}H_{K_F}\cos 2\beta)^{1/2} \tag{2}$$

and the resultant skew angle, $\alpha$, is $$\alpha = \tfrac{1}{2} \text{ arc tan} \frac{H_{K_F} \sin 2B}{H_{K_F} \cos 2B + H_{K_S}} \tag{3}$$

Equation 3 shows that whenever the edge of the strip is not lined up with the easy axis of the field induced anisotropy, a net skew exists which can cause the wall to intersect the strip edge. Accordingly, it is better to use a film strip with no magnetic field induced anisotropy whatsoever, and to rely entirely on the shape induced anisotropy.

Figure 9:
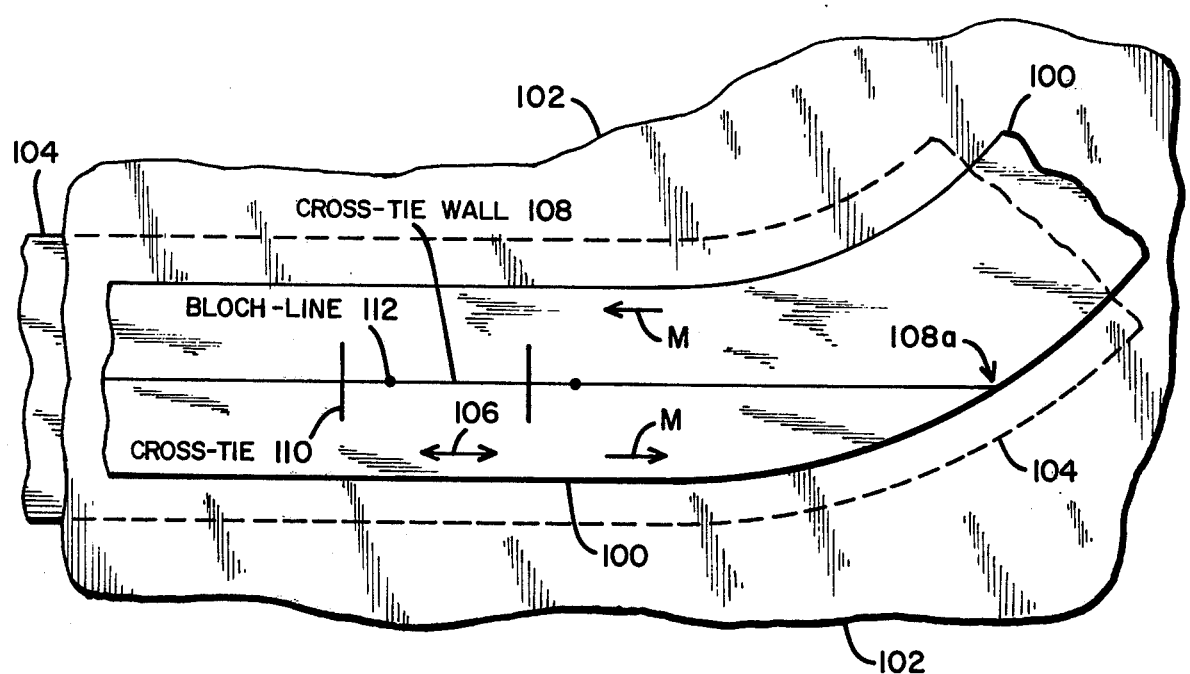
FIG. 9 is an illustration of the result of skew between the magnetic field induced easy axis and the edge of a curved data track.

With particular reference to FIG. 9, there is presented an illustration of a cross-tie wall memory and in particular a data track that is formed of a strip 100 of Permalloy film, about 350 Å in thickness and 10 microns (μm) in width. In this configuration, there is illustrated a non-magnetizable, e.g., glass, substrate member 102 having a copper microstrip 104 affixed to its bottom side and a thin ferromagnetic layer 100, having the easy axis 106, affixed to its top side. In the manner as discussed with particular reference to FIG. 6, there is provided a cross-tie wall 108 that is oriented parallel to the easy axis 106 with the magnetization above and below the cross-tie wall oriented in the leftwise and rightwise, respectively, directions as denoted by the magnetization vectors M.

Assuming a suitable drive line, such as drive line 30 of FIG. 3, coupled to film strip 100, but not illustrated, there are provided the cross-tie 110, Bloch-line 112 pairs oriented along the cross-tie wall 108 and structured along its length as by the configuration of the drive line 30, As film strip 100 has the property of uniaxial anisotropy, its easy axis 106, which is generated within film strip 100 upon its vacuum deposition by an orienting magnetic filed, consists of a substantially straight line. Cross-tie wall 108 in the area denoted as 108a, is skewed with respect to the edge of film strip 100 whereby cross-tie wall 108 is seen to run off the edge of film strip 100. Accordingly, in a thin ferromagnetic film layer having the property of uniaxial anisotropy, as does thin film strip 100, the information-containing cross-tie 110, Bloch-line 112 pairs, as they are propagated along the cross-tie wall 108 are compelled to follow the substantially straight cross-tie wall 108 rather than the contour of the thin film strip 100 whereby the cross-tie 110, Bloch-line 112 pairs are propagated off the edge of the curved portion of the film strip 100 such that their information content is lost.

Preferred Embodiment

Figure 10:
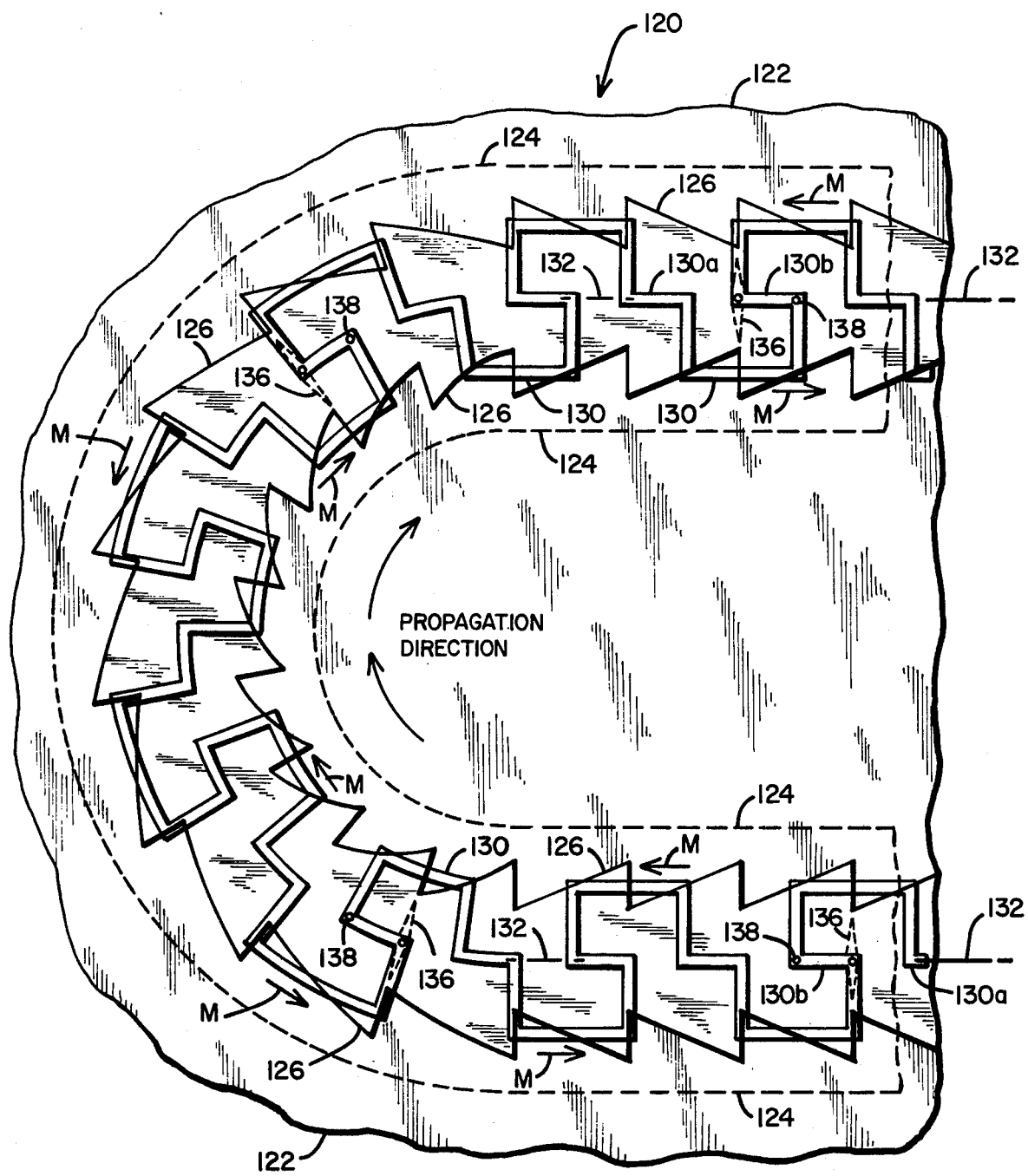
FIG. 10 is an illustration of a portion of a cross-tie wall memory system that incorporates the curved data track of the present invention.

With particular reference to FIG. 10, there is provided an illustration of a cross-tie wall memory system that incorporates the present invention. Memory plane 120 includes a non-magnetizable, e.g., glass or silicon, substrate member 122 having a copper microstrip 124 affixed to its bottom side and a curved thin, serrated ferromagnetic layer 126 configured in the manner taught by Schwee AIP Conference Proceedings and FIG. 8, affixed to its top side. The substrate may have layer 124 affixed to the top side, followed by an insulative and smoothing layer, e.g., SiO, then followed by layer 126, also on the top side. Affixed to the top side of layer 126 is the copper drive line 130 which is of the general conformation and design of that of the hereinabove discussed Lo, et al., U.S. Pat. No. 3,906,466 and as illustrated with particular reference to FIG. 3. Drive line 130 consists of a plurality of serially-intercoupled portions, each of which defines a memory cell, that are overlaid and uniformly spaced along centerline 132 which is substantially equidistant from the two edges of drive line 124 and film layer 126. Because of the shape induced anisotropy provided by the opposing edges of film strip 126 and the drive fields associated with the cross-tie wall memory system of memory plane 120, the cross-tie wall is constrained to follow the geometric centerline 132 of serrated film strip 126 which geometric centerline is aligned with the superposed portions 130a, 130b of drive line 130. As can be seen by the illustrated plan view of memory plane 120, the cross-tie wall 132 is constrained by the shape anisotropy of film strip 126 while drive line 130 and microstrip 124 are formed by well-known means into an integral assembly with their geometric centerlines superposed the geometric centerline 132 of film strip 126 and, accordingly the cross-tie wall 132. Accordingly, it can be seen that by the application of the appropriate wall placement and drive fields, such as illustrated and discussed with particular reference to the prior art configuration of FIG. 8 and FIG. 3, cross-tie 136, Bloch-line 138 pairs may be propagated along drive line 130 following the non-linear, e.g., curved, data track of cross-tie wall 132. A three pulse propagation sequence using only one drive line (124) could also be used—see Schwee, et al., IEEE Transactions On Magnetics, MAG 12, 608-613 (1976).

Making a thin ferromagnetic film that has no anisotropy at all is not a trivial task. People have reported attempts to make isotropic films by vacuum depositing at normal incidence in the absence of a magnetic field, and have found that magnetic anisotropy is still developed; however, the orientation of the easy axis is not predictable, although anisotropy values about the same as those for films deposited in a field are obtained (see, e.g., "Anisotropy In Nickle-Iron Films" by D. O. Smith, Journal Of Applied Physics 32, 705-805, March 1976). This implies that the applied field merely defines the direction of M which in turn determines the magnetic anisotropy. Likewise, people have tried to make completely isotropic films by depositing while the applied field is rotated uniformly (see, e.g., Chapter 7, *Magnetic Properties Of Metals and Alloys*, American Society for Metals, Cleveland, Ohio, 1960 by J. B. Goodenough and D. O. Smith). They found that arrays of such films still had small but significant amounts of anisotropy, and they deduced from the differing orientations of the easy axes in the array that this residual anisotropy is due to angle of incidence effects.

A novel and previously unreported method of making completely isotropic films is to spin the substrate during deposition in the presence of a steady magnetic field. Films made by that method have been found experimentally to have anisotropy so low as to be undetectable by our most sensitive equipment.

Figure 11:
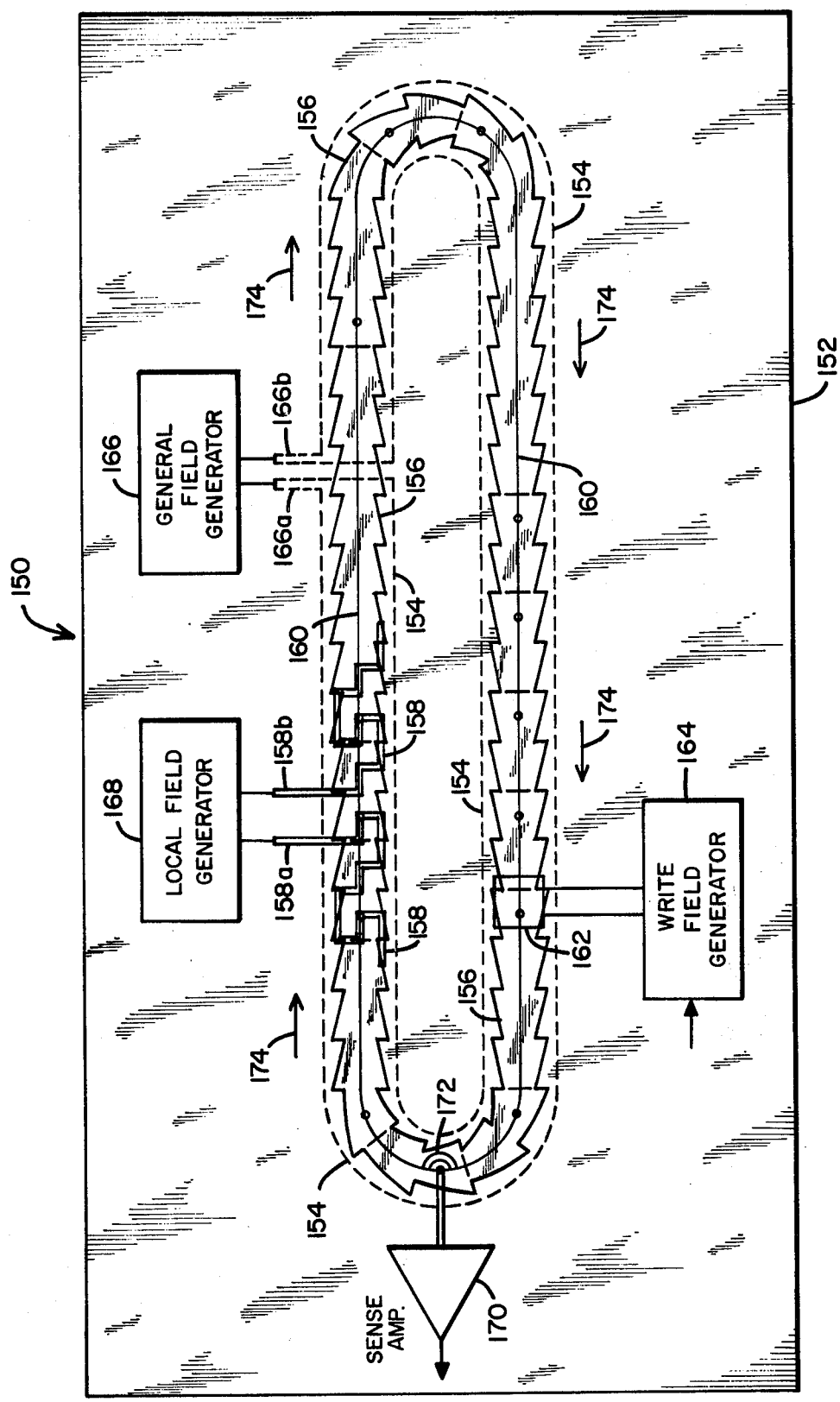
FIG. 11 is an illustration of a cross-tie wall memory system that incorporates the curved data track of FIG. 10.

With particular reference to FIGS. 11 and 12, there are presented illustrations of the memory plane 150 of the closed-loop cross-tie wall memory system of the present invention and the waveforms associated with the operation thereof. In the configuration of FIG. 11 there are illustrated a non-magnetizable, e.g., glass, substrate member 152 having a copper microstrip 154 affixed to its bottom side and a thin, serrated ferromagnetic layer, or film strip, 156 affixed to its top side. Copper microstrip 154 may also be on the top side of 152 if covered by a smoothing and insulating layer, e.g., SiO. Affixed to the top side of serrated layer 156 and superposed the microstrip 154 is the copper drive line 158 which is affixed to and superposed the magnetic layer 156 but separated therefrom by an insulative, e.g., SiO or Mylar, member. Drive line 158 consists of a plurality of serially-intercoupled portions, each of which defines a memory cell 1 through N, that are overlaid and uniformly spaced along a cross-tie wall 160 which is also oriented along the longitudinal axes of the superposed copper microstrip 154 and the thin, serrated ferromagnetic layer 156.

Superposed the top surface of thin, serrated ferromagnetic layer 156 and drive line 158 is a write drive line 162 driven by write field generator 164. Along the top edge of substrate member 152 is general field 22 generator 166 which is coupled across the two end terminals 166a, 166b of copper microstrip 154 for coupling the proper current signal thereto for generating the general field 22 in the area of thin, serrated ferromagnetic layer 156. Also located along the top edge of substrate member 152 is local field 20 generator 168 coupled across the two end terminals 158a, 158b of copper drive line 158 for coupling the appropriate current signal thereto, i.e., for coupling the local field 20 to thin, serrated ferromagnetic layer 156. Located at the lefthand curved end of thin, serrated ferromagnetic layer 156 is sense amplifier 170 and the associated pick-up element 172 for reading out the binary significance of the cross-tie, Bloch-line pairs that are generated by write field generator 164 and are serially propagated along cross-tie wall 160 in the direction denoted by arrows 174 by the serially-intercoupled portions of drive line 158 and microstrip 154, all as discussed in the D. S. Lo, et al., U.S. Pat. No. 3,906,466 and hereinabove.

What is claimed is:

1. In a cross-tie wall memory system in which binary data are stored as inverted Néel wall sections, which inverted Néel wall sections are bounded by a cross-tie on one end and by a Bloch-line on the other end, of a cross-tie wall in a magnetic layer and in which said binary data are generated in and are serially propagated along said cross-tie wall by appropriate drive fields, the improvement in which said magnetic layer is a strip of isotropic material that is configured into a major loop configuration and in which said cross-tie wall is constrained to follow the substantial geometric centerline of said curved strip by its shape induced anisotropy.

2. In a cross-tie wall memory system in which binary data are stored as inverted Néel wall sections, which inverted Néel wall sections are bounded by a cross-tie on one end and by a Bloch-line on the other end, of a cross-tie wall in a magnetic layer and in which said binary data are generated in and are serially propagated along said cross-tie wall by appropriate drive fields, the improvement in which said magnetic layer is configured into a curved strip of isotropic material whose two opposing edges are formed into uniformly spaced, repetitive patterns of asymmetrically serrated edges that are formed about the geometric centerline of the strip for establishing a cross-tie wall along said geometric centerline and structuring cross-tie, Bloch-line pairs along said cross-tie wall, said cross-tie wall being constrained to follow the substantial geometric centerline of said curved strip by its shaped induced anisotropy.

3. In a magnetic memory system in which binary data are stored as inverted Néel wall sections about an associated Bloch-line, which inverted Néel wall sections are generated in and are serially propagated along a wall in a magnetic layer by appropriate drive fields, the improvement in which said magnetic layer is a curved strip of isotropic material that is configured into a major loop configuration and in which said wall is constrained to substantially follow the geometric centerline of said curved strip by only its shape induced anisotropy.

4. In a magnetic memory system in which binary data are stored as inverted Néel wall sections about an associated Bloch-line, which inverted Néel wall sections are generated in and are serially propagated along a wall in a magnetic layer by appropriate drive fields, the improvement in which said magnetic layer is configured into a curved strip of isotropic material whose two opposing edges are formed into uniformly spaced, repetitive patterns of asymmetrically shaped edges which repetitive patterns are formed of successive narrow portions forming wide portions therebetween and which are formed about the geometric centerline of the strip for establishing a wall along said geometric centerline and structuring said Bloch-lines along said wall between adjacent narrow portions and in the wide portion therebetween, said wall being constrained to substantially follow the geometric centerline of said curved strip by only its shape induced anisotropy.

5. In a magnetic memory system in which binary data are stored as inverted Néel wall sections about an associated Bloch-line, which inverted Néel wall sections are generated in and are serially propagated along a wall in a magnetic layer by appropriate drive fields, the improvement in which said magnetic layer is a strip of isotropic material having curved portions that form said strip into a closed loop and having two opposing edges around said closed loop that are formed into uniformly spaced, repetitive patterns of shaped edges which repetitive patterns are formed of successive narrow portions forming wide portions therebetween and which are formed about the geometric centerline of the strip for establishing a wall along said geometric centerline and structuring said Bloch-lines along said wall, said wall being constrained to substantially follow the geometric centerline of said strip by only its shape induced anisotropy.

* * * * *